(12) United States Patent
Wu

(10) Patent No.: US 11,663,141 B2
(45) Date of Patent: May 30, 2023

(54) NON-STALLING, NON-BLOCKING TRANSLATION LOOKASIDE BUFFER INVALIDATION

(71) Applicant: TEXAS INSTRUMENTS INCORPORATED, Dallas, TX (US)

(72) Inventor: Daniel Brad Wu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/068,721

(22) Filed: Oct. 12, 2020

(65) Prior Publication Data

US 2021/0109867 A1 Apr. 15, 2021

Related U.S. Application Data

(60) Provisional application No. 62/914,061, filed on Oct. 11, 2019.

(51) Int. Cl.
| | |
|---|---|
| *G06F 12/10* | (2016.01) |
| *G06F 12/08* | (2016.01) |
| *G06F 9/48* | (2006.01) |
| *G06F 9/46* | (2006.01) |
| *H03M 13/15* | (2006.01) |
| *G06F 12/1027* | (2016.01) |

(Continued)

(52) U.S. Cl.
CPC .......... *G06F 12/1027* (2013.01); *G06F 9/467* (2013.01); *G06F 9/4881* (2013.01); *G06F 12/0862* (2013.01); *G06F 12/0882* (2013.01); *G06F 12/0891* (2013.01); *G06F 12/1009* (2013.01); *H03M 13/1575* (2013.01); *G06F 2212/1021* (2013.01); *G06F 2212/602* (2013.01); *G06F 2212/68* (2013.01)

(58) Field of Classification Search
CPC .... G06F 12/1027; G06F 9/467; G06F 9/4881; G06F 12/0862; G06F 12/0882; G06F 12/0891; G06F 12/1009; G06F 2212/1021; G06F 2212/602; G06F 2212/68; H03M 13/1575
See application file for complete search history.

(56) References Cited

U.S. PATENT DOCUMENTS 8,438,572 B2    5/2013  Fecioru
10,635,591 B1 *  4/2020  Venkatachar ....... G06F 12/0811
(Continued)

*Primary Examiner* — Masud K Khan
(74) *Attorney, Agent, or Firm* — Mandy Barsilai Fernandez; Frank D. Cimino

(57) ABSTRACT

A method includes receiving, by a MMU for a processor core, an address translation request from the processor core and providing the address translation request to a TLB of the MMU; generating, by matching logic of the TLB, an address transaction that indicates whether a virtual address specified by the address translation request hits the TLB; providing the address transaction to a general purpose transaction buffer; and receiving, by the MMU, an address invalidation request from the processor core and providing the address invalidation request to the TLB. The method also includes, responsive to a virtual address specified by the address invalidation request hitting the TLB, generating, by the matching logic, an invalidation match transaction and providing the invalidation match transaction to one of the general purpose transaction buffer or a dedicated invalidation buffer.

20 Claims, 6 Drawing Sheets

(51) Int. Cl.
*G06F 12/0862* (2016.01)
*G06F 12/1009* (2016.01)
*G06F 12/0891* (2016.01)
*G06F 12/0882* (2016.01)

(56) References Cited

U.S. PATENT DOCUMENTS

| | | |
|---|---|---|
| 10,642,501 B1 | 5/2020 | Patel et al. |
| 2013/0305250 A1 | 11/2013 | Durant |
| 2015/0242319 A1 | 8/2015 | Evans et al. |
| 2017/0090999 A1 | 3/2017 | Weber et al. |
| 2017/0277634 A1 | 9/2017 | Basu et al. |
| 2018/0203804 A1 | 7/2018 | Kraemer et al. |
| 2019/0332550 A1 | 10/2019 | Norman et al. |
| 2020/0042348 A1 | 2/2020 | Acharya et al. |
| 2020/0257635 A1* | 8/2020 | Park .................... G06F 12/1036 |
| 2020/0371951 A1* | 11/2020 | Chatterjee ........... G06F 12/1027 |

* cited by examiner

NON-STALLING, NON-BLOCKING TRANSLATION LOOKASIDE BUFFER INVALIDATION

CROSS-REFERENCE TO RELATED APPLICATIONS

The present application claims priority to U.S. Provisional Patent Application No. 62/914,061, which was filed Oct. 11, 2019, is titled "Memory Management Unit For A Processor," and is hereby incorporated herein by reference in its entirety.

BACKGROUND

Managing interactions between multiple software applications or program tasks and physical memory involves address translation (e.g., between a virtual address and a physical address or between a first physical address and a second physical address). Software applications or program task modules are generally compiled with reference to a virtual address space. When an application or task interacts with physical memory, address translation is performed to translate a virtual address into a physical address in the physical memory. Address translation consumes processing and/or memory resources. A cache of translated addresses, referred to as a translation lookaside buffer (TLB), improves address translation performance.

SUMMARY

In accordance with at least one example of the disclosure, a method includes receiving, by a MMU for a processor core, an address translation request from the processor core and providing the address translation request to a TLB of the MMU; generating, by matching logic of the TLB, an address transaction that indicates whether a virtual address specified by the address translation request hits the TLB; providing the address transaction to a general purpose transaction buffer; and receiving, by the MMU, an address invalidation request from the processor core and providing the address invalidation request to the TLB. The method also includes, responsive to a virtual address specified by the address invalidation request hitting the TLB, generating, by the matching logic, an invalidation match transaction and providing the invalidation match transaction to one of the general purpose transaction buffer or a dedicated invalidation buffer.

In accordance with another example of the disclosure, a system includes a processor core and a memory management unit (MMU) coupled to the processor core, the MMU comprising a translation lookaside buffer (TLB). The MMU is configured to receive an address translation request from the processor core and provide the address translation request to the TLB and receive an address invalidation request from the processor core and provide the address invalidation request to the TLB. The TLB further includes matching logic configured to generate an address transaction that indicates whether a virtual address specified by the address translation request hits the TLB; provide the address transaction to a general purpose transaction buffer; and responsive to a virtual address specified by the address invalidation request hitting the TLB, generate an invalidation match transaction and provide the invalidation match transaction to one of the general purpose transaction buffer or a dedicated invalidation buffer.

In accordance with yet another example of the disclosure, a memory management unit (MMU) includes a translation lookaside buffer (TLB) having a plurality of pipeline stages configured to implement matching logic; a general purpose transaction buffer coupled to the TLB; and a dedicated invalidation buffer coupled to the TLB. The TLB is configured to receive an address translation request from a processor core and receive an address invalidation request from the processor core. The matching logic is configured to generate an address transaction that indicates whether a virtual address specified by the address translation request hits the TLB; provide the address transaction to the general purpose transaction buffer; and responsive to a virtual address specified by the address invalidation request hitting the TLB, generate an invalidation match transaction and provide the invalidation match transaction to one of the general purpose transaction buffer or a dedicated invalidation buffer.

BRIEF DESCRIPTION OF THE DRAWINGS

For a detailed description of various examples, reference will now be made to the accompanying drawings in which.

DETAILED DESCRIPTION

Figure 1:
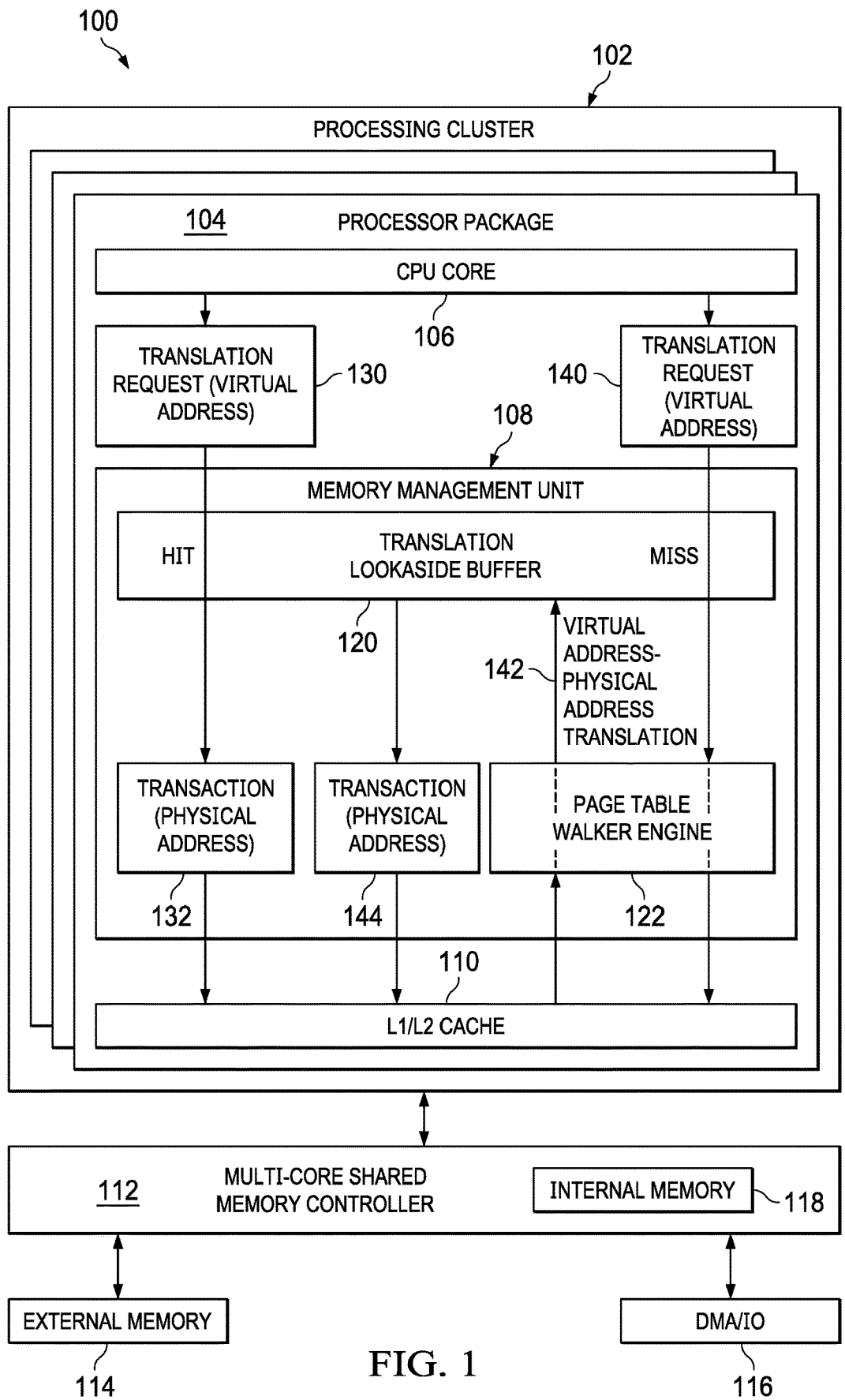
FIG. 1 is a block diagram of a multi-core processing system in accordance with various examples.

FIG. 1 is a functional block diagram of a multi-core processing system 100, in accordance with examples of this description. In one example, the system 100 is a multi-core system-on-chip (SoC) that includes a processing cluster 102 having one or more processor packages 104. In some examples, the one or more processor packages 104 include one or more types of processors, such as a central processor unit (CPU), graphics processor unit (GPU), digital signal processor (DSP), etc. In one example, a processing cluster 102 includes a set of processor packages split between DSP, CPU, and GPU processor packages. In some examples, each processor package 104 includes one or more processing cores 106. As used herein, the term "core" refers to a processing module that is configured to contain an instruction processor, such as a DSP or other type of microprocessor. Each processor package 104 also contains a memory management unit (MMU) 108 and one or more caches 110. In some example, the caches 110 include one or more level one (L1) caches and one or more level two (L2) caches. For example, a processor package 104 includes four cores 106, each core including an L1 data cache and L1 instruction cache, along with a L2 cache shared by the four cores 106.

The multi-core processing system 100 also includes a multi-core shared memory controller (MSMC) 112, which couples the processing cluster 102 to one or more external memories 114 and direct memory access/input/output (DMA/IO) clients 116. The MSMC 112 also includes an on-chip internal memory 118 that is directly managed by the MSMC 112. In certain examples, the MSMC 1112 manages traffic between multiple processor cores 106, other mastering peripherals or DMA clients 116 and allows processor packages 104 to dynamically share the internal and external memories for both program instructions and data. The MSMC internal memory 118 offers additional flexibility (e.g., to software programmers) because portions of the internal memory 118 are configured as a level 3 (L3) cache.

The MMU 108 is configured to perform address translation between a virtual address and a physical address, including intermediate physical addresses for multi-stage address translation. In some examples, the MMU 108 is also configured to perform address translation between a first physical address and a second physical address (e.g., as part of a multi-stage address translation). In particular, the MMU 108 helps to translate virtual memory addresses to physical memory addresses for the various memories of the system 100. The MMU 108 contains a translation lookaside buffer (TLB) 120 that is configured to store translations between addresses (e.g., between a virtual address and a physical address or between a first physical address and a second physical address). Although not shown for simplicity, in other examples the MMU 108 additionally includes a micro-TLB (uTLB), such as a fully associative uTLB, which, along with the TLB 120, serve as caches for page translations. In some examples, the TLB 120 also stores address pointers of page tables. In addition to address translations stored (e.g., cached) in the TLB 120, the MMU 108 includes one or more page table walker engines 122 that are configured to access or "walk" one or more page tables to translate a virtual address to a physical address, or to translate an intermediate physical address to a physical address. The function of the page table walker engine 122 is described further below.

The processor core 106 generates a transaction directed to a virtual address that corresponds to a physical address in memory (e.g., external memory 114). Examples of such transactions generated by the processor core 106 include reads from the memory 114 and writes to the memory 114; however, other types of transactions requiring address translation (e.g., virtual-to-physical address translation and/or physical-to-physical address translation) are also within the scope of this description. For ease of reference, any transaction that entails address translation is referred to as an address translation request (or "translation request"), and it is further assumed for simplicity that translation requests specify a virtual address to be translated to a physical address. The processor core 106 thus provides a translation request to the MMU 108.

Responsive to receiving a translation request from the processor core 106, the MMU 108 first translates the virtual address specified by the translation request to a physical address. A first example translation request 130 is provided by the processor core 106 to the MMU 108. The MMU 108 first determines whether the first translation request 130 hits the TLB 120 (e.g., the TLB 120 already contains the address translation for the virtual address specified by the first translation request 130). In this example, the first translation request 130 does hit the TLB 120, and thus the MMU 108 forwards a transaction 132 that includes the translated physical address to a lower level memory (e.g., the caches 110) for further processing.

A second example translation request 140 is provided by the processor core 106 to the MMU 108. The MMU 108 again determines whether the second translation request 140 hits the TLB 120. In this example, the second translation request 140 misses (e.g., does not hit) the TLB 120. Responsive to the second translation request 140 missing the TLB 120, the MMU 108 provides the second translation request 140 to its page table walker engine 122, which accesses (e.g., "walks") one or more page tables in a lower level memory (e.g., the caches 110, 118, or external memory 114) to translate the virtual address specified by the second translation request 140 to a physical address. The process of walking page tables is described in further detail below. Once the page table walker engine 122 translates the virtual address to a physical address, the address translation is stored in the TLB 120 (depicted as arrow 142), and the MMU 108 forwards a transaction 144 that includes the translated physical address to a lower level memory for further processing.

A third possibility exists, in which the translation request from the processor core 106 only partially hits the TLB 120. In such a situation, which will be described further below, the page table walker engine 122 still walks one or more page tables in the lower level memory to translate the virtual address specified by the translation request to a physical address. However, because the translation request partially hit the TLB 120, a reduced number of page tables are walked in order to perform the address translation relative to a translation request that completely misses the TLB 120.

Figure 2:
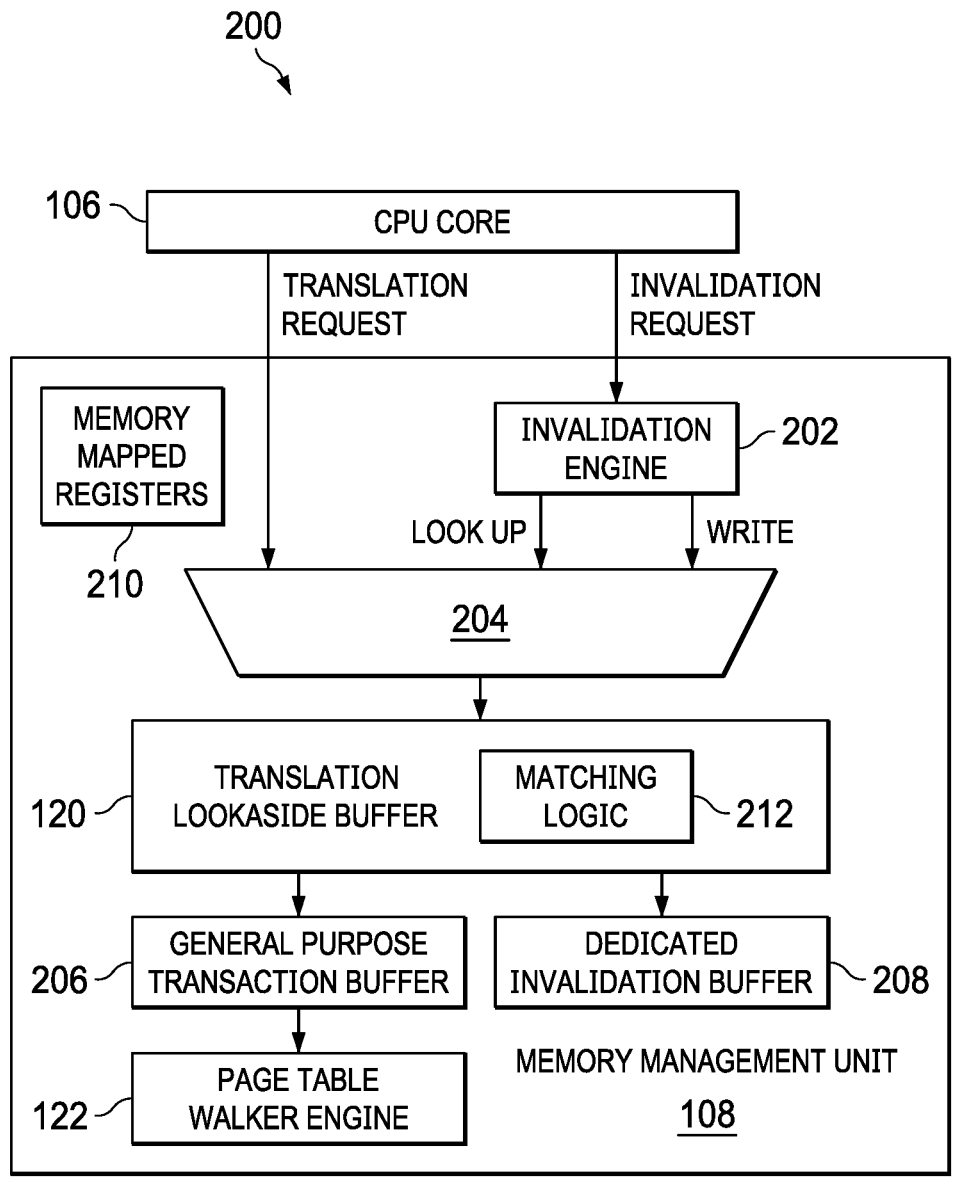
FIG. 2 is a block diagram showing a memory management unit in greater detail and in accordance with various examples.

FIG. 2 is a block diagram of a system 200 that includes a processor core 106 and MMU 108, which itself includes the TLB 120 and page table walker engine 122, as described above. In the example of FIG. 2, the MMU 108 is shown in further detail and includes an invalidation engine 202, a transaction multiplexer (mux) 204, a general purpose transaction buffer 206, a dedicated invalidation buffer 208, and one or more memory mapped registers (MMRs) 210 that are used to control and/or configure various functionality of the MMU 108. In some examples, the TLB 120 includes multiple pipeline stages (shown as matching logic 212) that facilitate the TLB 120 receiving a translation request and determining whether the virtual address specified by the translation request hits the TLB 120, partially hits the TLB 120, or misses the TLB 120.

As described above, the processor core 106 is configured to provide various translation requests to the MMU 108, which are provided to the transaction mux 204 as shown. In some examples, the processor core 106 is configured to provide address invalidation requests (or "invalidation requests") to the MMU 108 in addition to the translation requests. Invalidation requests are requests to invalidate one or more entries in the TLB 120. In some examples, invalidation requests are for a single entry (e.g., associated with a particular virtual address) in the TLB 120, while in other examples, invalidation requests are for multiple entries (e.g., associated with a particular application ID) in the TLB 120. The invalidation requests are provided to the invalidation engine 202 of the MMU 108, which in turn forwards such invalidation requests to be looked up in the TLB 120 to the transaction mux 204 as shown. Regardless of the type of request, the transaction mux 204 is configured to pass both translation requests and invalidation requests to the TLB 120. In some examples, control logic provides control signals to the transaction mux 204 to select one of the inputs to the transaction mux 204 to be provided as the output of the transaction mux 204. In an example, address translation requests are prioritized over address invalidation requests until there are no more available spots in the general purpose transaction buffer 206 for such address translation requests.

Responsive to receiving a request (e.g., either a translation request or an invalidation request), the matching logic 212 (e.g., implemented by pipeline stages of the TLB 120) determines whether the request hits the TLB 120, partially hits the TLB 120, or misses the TLB 120.

Depending on the type of request, various resulting transactions are produced by the matching logic 212. For example, a translation request can hit the TLB 120, partially hit the TLB 120, or miss the TLB 120. An invalidation request can either hit the TLB 120 or miss the TLB 120, because an invalidation request that only partially hits an entry in the TLB 120 should not result in invalidating that entry in some examples. In other examples, an invalidation request can also partially hit the TLB 120. For example, a partial hit on the TLB 120 exists when a request hits on one or more pointers to page table(s), but does not hit on at least the final page table. A hit on the TLB 120 exists when a request hits on both the one or more pointers to page table(s) as well as the final page table itself. In some examples, an invalidation request includes a "leaf level" bit or field that specifies to the MMU 108 whether to invalidate only the final page table (e.g., partial hits on the TLB 120 do not result in invalidating an entry) or to invalidate pointers to page table(s) as well (e.g., a partial hit on the TLB 120 results in invalidating an entry).

Responsive to a translation request that hits the TLB 120, the MMU 108 provides an address transaction specifying a physical address to the general purpose transaction buffer 206. In this example, the general purpose transaction buffer 206 is a first-in, first-out (FIFO) buffer. Once the address transaction specifying the physical address has passed through the general purpose transaction buffer 206, the MMU 108 forwards that address transaction to a lower level memory to be processed.

Responsive to a translation request that partially hits the TLB 120 or misses the TLB 120, the MMU 108 provides an address transaction that entails further address translation to the general purpose transaction buffer 206. For example, if the translation request misses the TLB 120, the address transaction provided to the general purpose transaction buffer 206 entails complete address translation (e.g., by the page table walker engine 122). In another example, if the translation request partially hits the TLB 120, the address transaction provided to the general purpose transaction buffer 206 entails additional, partial address translation (e.g., by the page table walker engine 122). Regardless of whether the address transaction entails partial or full address translation, once the address transaction that entails additional translation has passed through the general purpose transaction buffer 206, the MMU 108 forwards that address transaction to the page table walker engine 122, which in turn performs the address translation.

Generally, performing address translation is more time consuming (e.g., consumes more cycles) than simply processing a transaction such as a read or a write at a lower level memory. Thus, in examples where multiple translation requests miss the TLB 120 or only partially hit the TLB 120 (e.g., entails some additional address translation be performed by the page table walker engine 122), the general purpose transaction buffer 206 can back up and become full. The processor core 106 is aware of whether the general purpose transaction buffer 206 is full and, responsive to the general purpose transaction buffer 206 being full, the processor core 106 temporarily stalls from sending additional translation requests to the MMU 108 until space becomes available in the general purpose transaction buffer Responsive to an invalidation look-up request that hits the TLB 120, the MMU 108 provides a transaction specifying that an invalidation match occurred in the TLB 120, referred to as an invalidation match transaction for simplicity. Responsive to the general purpose transaction buffer 206 having space available (e.g., not being full), the MMU 108 is configured to provide the invalidation match transaction to the general purpose transaction buffer 206. However, responsive to the general purpose transaction buffer 206 being full, the MMU 108 is configured to provide the invalidation match transaction to the dedicated invalidation buffer 208. In this example, the dedicated invalidation buffer 208 is also a FIFO buffer. As a result, even in the situation where the general purpose transaction buffer 206 is full (e.g., due to address translation requests missing or only partially hitting the TLB 120, and thus backing up in the general purpose transaction buffer 206), the processor core 106 is able to continue sending invalidation requests to the MMU 108 because the invalidation requests are able to be routed to the dedicated invalidation buffer 208, and thus are not stalled behind other translation requests.

Regardless of whether the invalidation match transaction is stored in the general purpose transaction buffer 206 or the dedicated invalidation buffer 208, once the invalidation match transaction passes through one of the buffers 206, 208, the invalidation match transaction is provided to the invalidation engine 202, which is in turn configured to provide an invalidation write transaction to the TLB 120 to invalidate the matched entry or entries. In an example, invalidation look-up requests that miss the TLB 120 are discarded (e.g., not provided to either the general purpose transaction buffer 206 or the dedicated invalidation buffer 208).

Figure 3A:
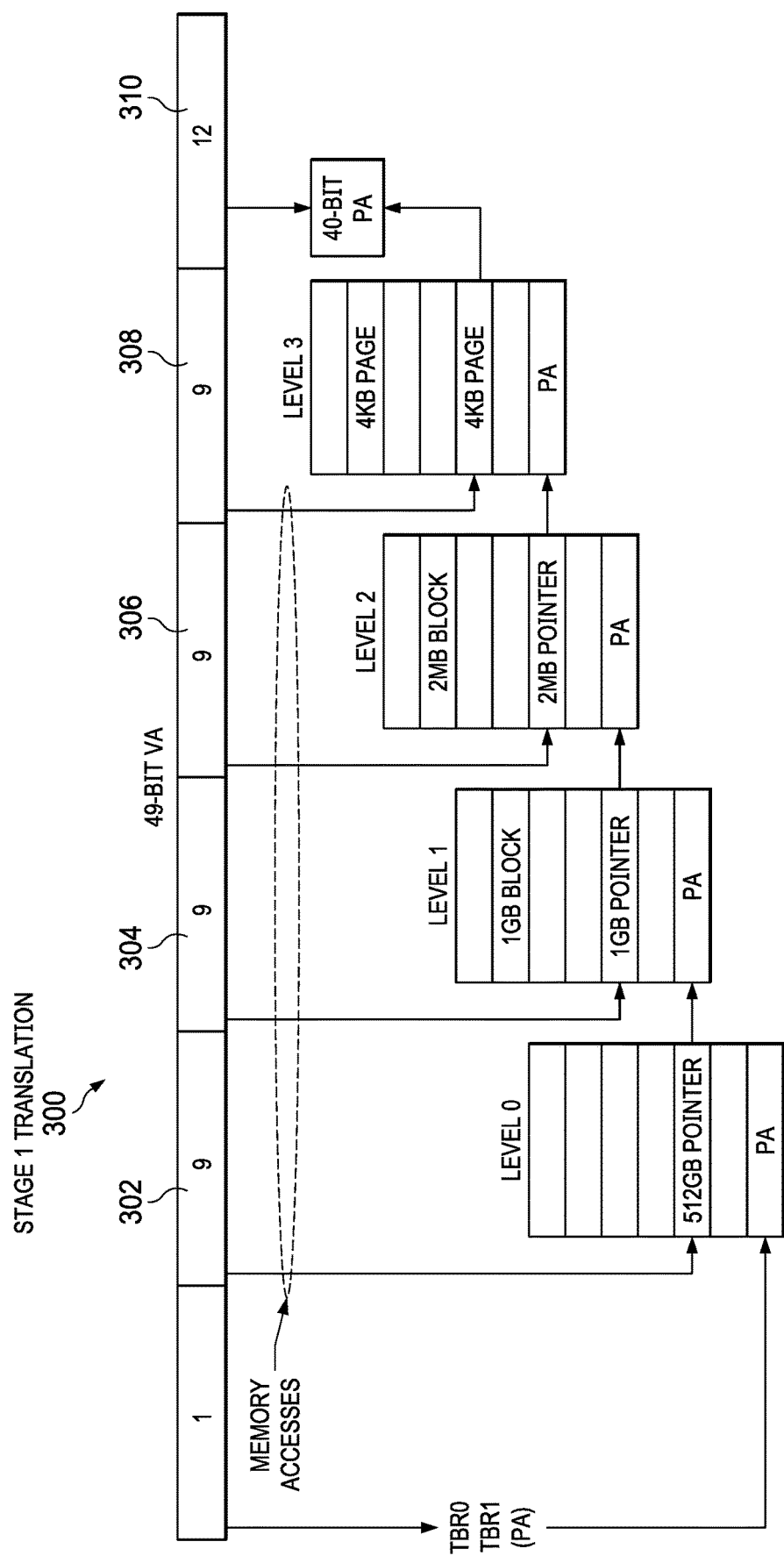
FIGS. 3a and 3b are examples of one- and two-stage address translation in accordance with various examples.

FIG. 3a is an example translation 300 for translating a 49-bit virtual address (VA) to a physical address (PA) in accordance with examples of this description. The example translation 300 is representative of the functionality performed by the page table walker engine 122 responsive to receiving a transaction that entails full or partial address translation.

In this example, the most significant bit of the 49-bit VA specifies one of two table base registers (e.g., TBR0 or TBR1, implemented in the MMRs 210). The table base registers each contain a physical address that is a base address of a first page table (e.g., Level 0). In this example, each page table includes 512 entries, and thus an offset into a page table is specified by nine bits. A first group of nine bits 302 provides the offset from the base address specified by the selected table base register into the Level 0 page table to identify an entry in the Level 0 page table. The identified entry in the Level 0 page table contains a physical address that serves as a base address of a second page table (e.g., Level 1).

A second group of nine bits 304 provides the offset from the base address specified by entry in the Level 0 page table into the Level 1 page table to identify an entry in the Level 1 page table. The identified entry in the Level 1 page table contains a physical address that serves as a base address of a third page table (e.g., Level 2).

A third group of nine bits 306 provides the offset from the base address specified by entry in the Level 1 page table into the Level 2 page table to identify an entry in the Level 2 page table. The identified entry in the Level 2 page table contains a physical address that serves as a base address of a fourth, final page table (e.g., Level 3).

A fourth group of nine bits 308 provides the offset from the base address specified by entry in the Level 2 page table into the Level 3 page table to identify an entry in the Level 3 page table. The identified entry in the Level 3 page table contains a physical address that serves as a base address of an exemplary 4 KB page of memory. The final 12 bits 310 of the VA provide the offset into the identified 4 KB page of memory, the address of which is the PA to which the VA is translated.

Figure 3B:
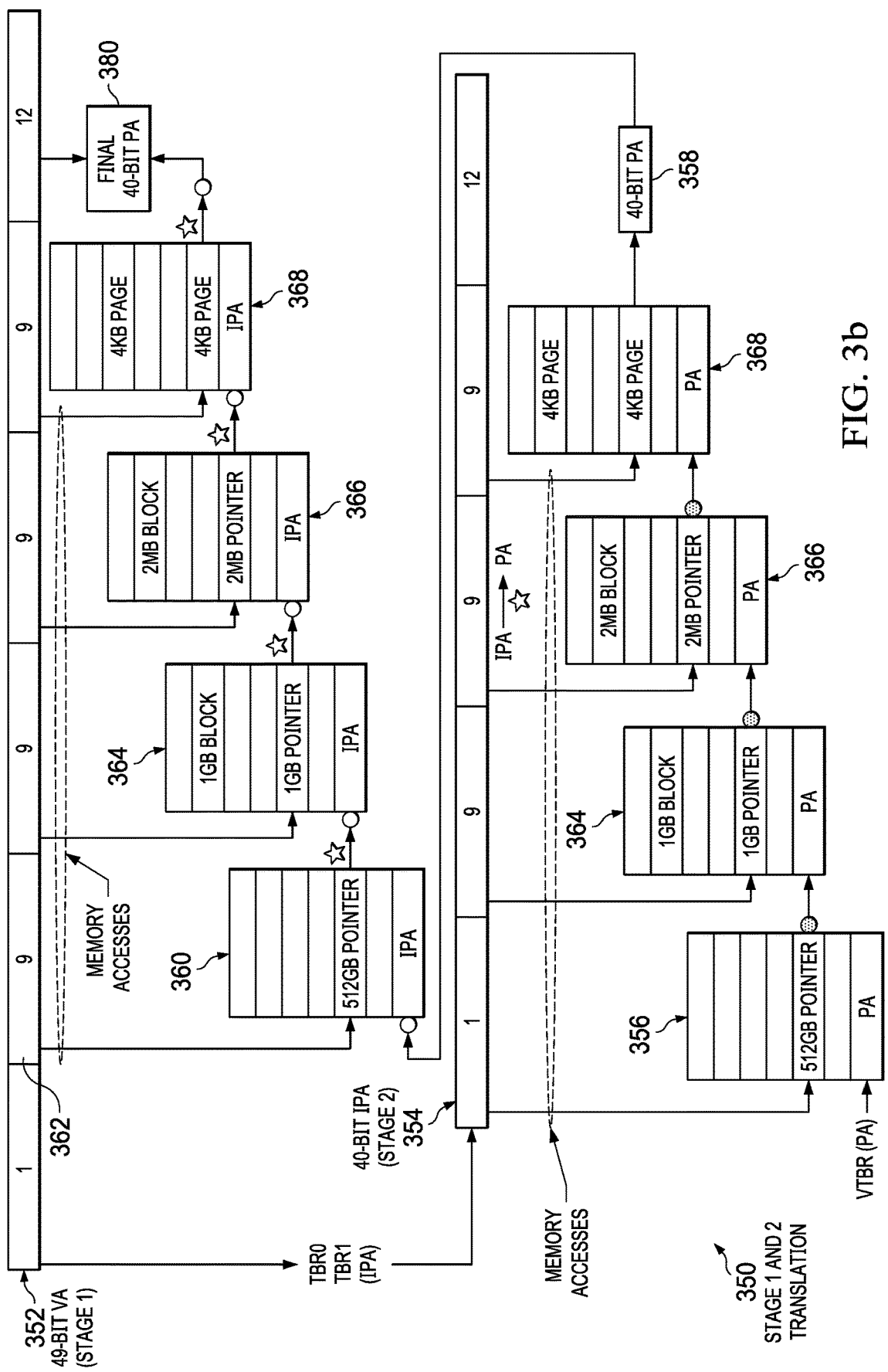

FIG. 3b is an example two-stage translation 350 for translating a 49-bit virtual address (VA) to a physical address (PA), including translating one or more intermediate physical addresses (IPA) in accordance with examples of this description. In an example, a value of one of the MMRs 210 of the MMU 108 is determinative of whether the MMU 108 is configured to perform one-stage translation as shown in FIG. 3a or two-stage translation as shown in FIG. 3b. The example translation 350 is representative of the functionality performed by the page table walker engine 122 responsive to receiving a transaction that entails full or partial address translation.

The two-stage translation 350 differs from the one-stage translation 300 described above in that the physical address at each identified entry is treated as an intermediate physical address that is itself translated to a physical address. For example, the most significant bit of the 49-bit VA 352 again specifies one of two table base registers (e.g., TBR0 or TBR1, implemented in the MMRs 210). However, the physical address contained by the selected table base register is treated as IPA 354, which is translated to a physical address. In this example, a virtual table base register (e.g., VTBR, implemented in the MMRs 210) contains a physical address that is a base address of a first page table 356. The remainder of the IPA 354 is translated as described above with respect to the 49-bit VA of FIG. 3a.

The resulting 40-bit PA 358 is a base address for a first page table 360 for the translation of the 49-bit VA 352 to the final 40-bit PA 380, while a first group of nine bits 362 of the VA 352 provides the offset from the base address specified by the PA 358 into the first page table 360 to identify an entry in the first page table 360. However, unlike the one-stage translation 300, the entry in the first page table 360 is treated as an IPA (e.g., replacing previous IPA 354) that is itself translated to a new PA 358, which is then used as a base address for a second page table 364. That is, the entry in the first page table 360 is not used directly as a base address for the second page table 364, but rather is first translated as an IPA 354 to a PA 358 and that resulting PA 358 is then used as the base address for the second page table 364. This process continues in a like manner for a third page table 366 and a fourth page table 368 before arriving at the final 40-bit PA 380. For example, the address contained in the final Level 3 page table (e.g., page table 368) is also an IPA that is translated in order to arrive at the final 40-bit PA 380.

Thus, while performing a one-stage translation 300 may entail multiple memory accesses, performing a two-stage translation 350 may entail still more memory accesses, which can reduce performance when many such translations are performed. Additionally, FIGS. 3a and 3b are described with respect to performing a full address translation. However, as described above, in some instances a translation request partially hits the TLB 120, for example where a certain number of most significant bits of a virtual address of the translation request match an entry in the TLB 120. In such examples, the page table walker engine 122 does not necessarily perform each level of the address translation and instead only performs part of the address translation. For example, referring to FIG. 3a, if the most significant 19 bits of a virtual address of a translation request match an entry in the TLB 120, the page table walker engine 122 begins with the base address of the Level 2 page table and only needs to perform address translation using the third and fourth groups of nine bits 306, 308. In other examples, similar partial address translations are performed with regard to a two-stage translation 350.

Referring back to FIG. 2, invalidation match transactions are able to be stored in the general purpose transaction buffer 206 or the dedicated invalidation buffer 208, and thus are not stalled behind other translation requests. For example, in a situation in which the general purpose transaction buffer 206 is full (e.g., pending the page table walker engine 122 performing address translations for transactions in the general purpose transaction buffer 206), an invalidation match transaction is still able to be stored in the dedicated invalidation buffer 208.

In the example of FIG. 2, the general purpose transaction buffer 206 and the dedicated invalidation buffer 208 are shown as separate blocks. However, in other examples, the buffers 206, 208 are combined in a single buffer and accounting is performed (e.g., by the processor core 106, being aware of the size of the single buffer) so that space is available in the single buffer for an invalidation match transaction. For example, if the single buffer has a size of N, the processor core 106 is configured to stall additional translation requests once the single buffer reaches a capacity of N−1.

Additionally, once an invalidation match transaction passes through one of the buffers 206, 208, the invalidation match transaction is provided to the invalidation engine 202, which is in turn configured to provide an invalidation write transaction to the TLB 120 to invalidate the matched entry or entries. In an example, invalidation look-up requests that miss the TLB 120 are discarded (e.g., not provided to either the general purpose transaction buffer 206 or the dedicated invalidation buffer 208).

In some examples, TLB 120 invalidation is a multi-cycle process (e.g., where the invalidation request is for multiple TLB 120 entries, for example by specifying that all entries associated with an application ID should be invalidated). In some cases, the processor core 106 is blocked until the completion of a TLB 120 invalidation, and thus the invalidation requests generated as part of the TLB 120 invalidation are blocking in nature. In other cases, an invalidation request generated as part of a TLB 120 invalidation is itself stalled due to a backup of translation requests in the TLB 120 (or an associated buffer).

However, in accordance with examples of this description, the MMU 108 is configured such that TLB 120 invalidation occurs in a non-stalling, non-blocking manner. For example, and as described above with respect to FIG. 2, an invalidation request generated by the processor core 106 is able to proceed through the TLB 120 (e.g., to determine whether the invalidation request hits or misses the TLB 120) regardless of whether a backup of translation requests in the TLB 120 exists, and thus the invalidation request is non-stalling.

As another example, the processor 106 is able to continue sending translation requests to the MMU 108 and the TLB 120 during a TLB 120 invalidation, and thus the TLB 120 invalidation is also non-blocking with respect to these translation requests. As described further below, the invalidation engine 202 receives an invalidation match transaction from one of the buffers 206, 208 and determines whether there are any in-flight address translation requests (e.g., address translation requests in the matching logic 212 pipeline) or address transactions (e.g., in the general purpose transaction buffer 206 or having address translation performed by the page table walker-engine 122) that match the invalidation match transaction. In some examples, a match between an invalidation match transaction and address translation requests and/or address transactions is determined based on whether a virtual address of the invalidation match transaction matches a virtual address of the address translation request or address transaction. In other examples, the match between an invalidation match transaction and address translation requests and/or address transactions is additionally determined based on whether an application ID of the invalidation match transaction matches an application ID of the address translation request or address transaction.

Regardless of whether a match is determined, the invalidation engine 202 is configured to mark or otherwise identify in-flight address translation requests or address transactions that match an invalidation request received by the invalidation engine 202. The effect of marking such in-flight address translation requests (or address transactions that entail additional address translation) is that the resulting address translation will not be cached in the TLB 120. The resulting address translation is not cached in the TLB 120 because such address translation corresponds to the invalidation request and thus is to be invalidated (e.g., removed) from the TLB 120. Thus, even in an example in which an invalidation request misses the TLB 120, a matching in-flight address translation request or address transaction is still marked so that the resulting address translation is not cached in the TLB 120. In some examples, the MMU 108 includes a micro-TLB (uTLB) in addition to the TLB 120. In these examples, a resulting address translation from a marked request/transaction is able to be cached in the uTLB, which avoids the need to re-translate (e.g., re-walking page tables by the page table walker engine 122) the invalidation translation address. However, the resulting address translation is invalidated in the uTLB in response to the corresponding resulting address translation being invalidated in the TLB 120.

As a result of so marking in-flight address translation requests or address transactions, the processor core 106 is able to continue to send address translation requests without the possibility that such address translation requests will result in the TLB 120 being populated with an entry that should actually have been invalidated. Additionally, non-marked in-flight address translation requests or address transactions are still able to be processed as normal, including caching a resulting address translation (e.g., in the TLB 120). Thus, upon completion of a TLB 120 invalidation (e.g., a single invalidation request or a series of invalidation requests), the TLB 120 is cleared of address translations to be invalidated, while address translation requests from the processor core 106 are unimpeded during the TLB 120 invalidation.

As described above, the MMU 108 is configured to receive address translation requests and address invalidation requests from the processor core 106. These requests are provided to the TLB 120 and matching logic 212 is applied (e.g., in pipe stages of the TLB 120) to such requests to determine whether the request hits the TLB 120, partially hits the TLB 120, or misses the TLB 120.

In the case of an address translation request, the matching logic 212 is configured to generate an address transaction that indicates whether a virtual address (among other attributes, such as an application ID) specified by the address translation request hits the TLB 120 (e.g., does not entail additional address translation) or only partially hits or misses the TLB 120 (e.g., requiring additional address translation). The address transaction is provided to the general purpose transaction buffer 206, which is a FIFO buffer as described above. The address transaction then proceeds through the buffer 206. Upon exiting the buffer 206, an address transaction associated with an address translation request that hit the TLB 120 includes a physical address and is provided (e.g., directly from the buffer 206 or by the page table walker engine 122 as an intermediary) to a lower level memory (e.g., the caches 110, 118, or external memory 114) to be processed. On the other hand, upon exiting the buffer 206, an address transaction associated with an address translation request that partially hit or missed the TLB 120 is provided to the page table walker engine 122, which in turn performs the address translation.

In the case of an address invalidation request (or an invalidation look-up request), the matching logic 212 is configured to generate an invalidation match transaction responsive to a virtual address (among other attributes, such as an application ID) specified by the address invalidation request hitting the TLB 120 (e.g., does not entail additional address translation). In examples in which the address invalidation request indicates that all entries associated with an application ID are to be invalidated, such invalidation request hits the TLB 120 responsive to the TLB 120 containing an entry or entries having the specified application ID. In some examples, if the address invalidation request only partially hits or misses the TLB 120, the address invalidation request is discarded (e.g., does not proceed to one of the buffers 206, 208). In other examples, the matching logic 212 is also configured to generate an invalidation match transaction responsive to a virtual address (among other attributes, such as an application ID) specified by the address invalidation request partially hitting the TLB 120. As described above, a partial hit on the TLB 120 exists when a request hits on one or more pointers to page table(s), but does not hit on at least the final page table.

The invalidation match transaction is provided to either the general purpose transaction buffer 206 or the dedicated invalidation buffer 208, which is also a FIFO buffer as described above. Responsive to the general purpose transaction buffer 206 being full (e.g., backed up pending address translation(s) being performed by the page table walker engine 122), the invalidation match transaction is provided to the dedicated invalidation buffer 208. Regardless of the buffer 206, 208 to which the invalidation match transaction is provided, the invalidation match transaction then proceeds through the buffer 206, 208. Upon exiting the buffer 206, 208, the invalidation match transaction is provided to the invalidation engine 202, which is in turn configured to provide an invalidation write (W) transaction to the TLB 120 to invalidate the matched entry or entries.

In addition to providing the invalidation write transaction to the TLB 120, the invalidation engine 202 is also configured to process an invalidation match transaction by determining whether the invalidation match transaction matches any in-flight address translation requests or address transactions. Regardless of whether a match is determined, the invalidation engine 202 marks or otherwise identifies in-flight address translation requests or address transactions that match an invalidation request received by the invalidation engine 202. As described above, the effect of marking such in-flight address translation requests (or address transactions that entail additional address translation) is that the resulting address translation will not be cached in the TLB 120.

In some examples, the invalidation engine 202 is configured to provide error correction and/or detection in addition to facilitating the non-stalling, non-blocking TLB 120 invalidation described above. Error correcting codes (ECC) are used as a measure for protecting memories (e.g., TLB 120) against transient and permanent faults that occur during functional operation. In various examples, the TLB 120 is configured to implement one of different levels of ECC protection, including zero protection, single-error detection (SED), and single-error correction, double-error detection (SECDED). In other examples, parity schemes such as full parity or even/odd parity are used to protect the TLB 120 against transient and permanent faults that occur during functional operation.

The invalidation engine 202 is optionally configured to function as a "scrubber" of entries in the TLB 120 for errors (e.g., based on ECC syndromes or parity bits for the TLB 120 entries). For example, in addition to invalidating one or more entries in the TLB 120 (e.g., responsive to receiving an invalidation request from the processor core 106), the invalidation engine is also configured to check one or more entries in the TLB 120 to determine whether errors are present, and correcting or invalidating the entries in the TLB 120 containing errors.

In an example, the invalidation engine 202 is configured to re-calculate a SECDED ECC syndrome for an entry in the TLB 120. In this example, the invalidation engine 202 then determines that a single error is present in the entry in the TLB 120 based on a comparison of the re-calculated SECDED ECC syndrome and a stored SECDED ECC syndrome associated with the entry in the TLB 120. As a result of detecting a single error, which is correctable when protected with a SECDED ECC syndrome, the invalidation engine 202 is configured to overwrite the entry in the TLB 120 with a corrected entry, in which single error is corrected. Finally, the invalidation engine 202 is configured to update the stored SECDED ECC syndrome based on the corrected entry. Thus, the invalidation engine 202 is configured not only to perform non-stalling, non-blocking TLB 120 invalidation, but also to correct errors in the TLB 120 as part of the transaction.

In another example, the invalidation engine 202 determines that more than one error is present in the entry in the TLB 120 based on a comparison of the re-calculated SECDED ECC syndrome and the stored SECDED ECC syndrome associated with the entry in the TLB 120. As a result of detecting a double error (or greater), which is detectable but not correctable when protected with a SECDED ECC syndrome, the invalidation engine 202 is configured to invalidate the entry in the TLB 120 for which the double error was detected. Further, in the event that parity bits are used to detect errors, as a result of detecting an error based on such parity bits (which is also not correctable), the invalidation engine 202 is configured to invalidate the entry in the TLB 120 for which the parity error was detected.

Figure 4:
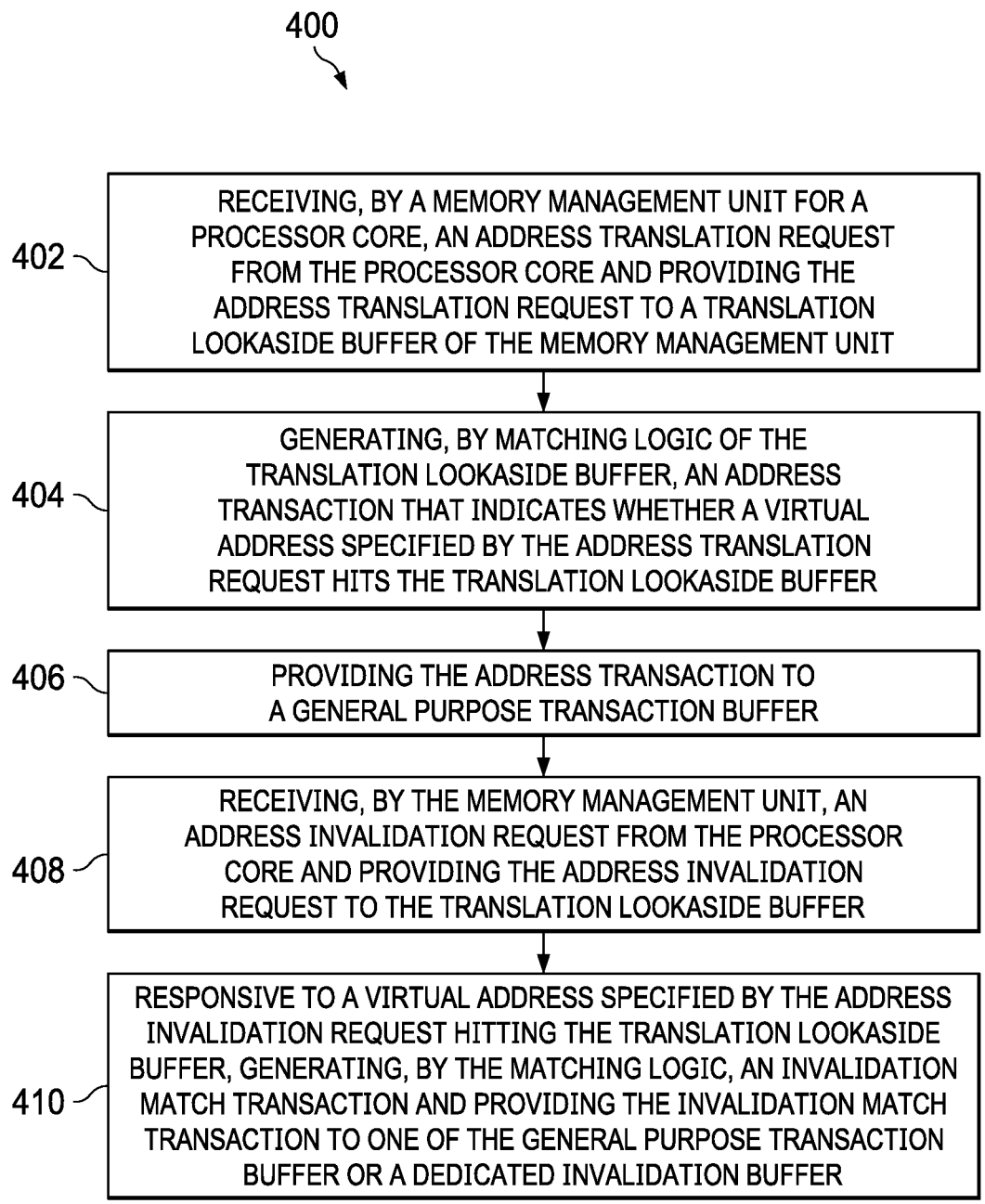
FIG. 4 is a flow chart of a method of non-stalling, non-blocking TLB invalidation in accordance with various examples.

FIG. 4 is a flow chart of a method 400 of non-stalling, non-blocking TLB 120 invalidation in accordance with various examples. The method 400 begins in block 402 with receiving, by the MMU 108 for a processor core 106, an address translation request from the processor core 106 and providing the address translation request to the TLB 120 of the MMU 108. As described above, the address translation request can hit the TLB 120, partially hit the TLB 120, or miss the TLB 120.

The method 400 thus continues to block 404 with generating, by matching logic 212 of the TLB 120, an address transaction that indicates whether a virtual address specified by the address translation request hits the TLB 120. The method 400 then continues to block 406 with providing the address transaction to a general purpose transaction buffer 206.

The method next continues to block 408 with receiving, by the MMU 108, an address invalidation request from the processor core 106 and providing the address invalidation request to the TLB 120. Invalidation requests are requests to invalidate one or more entries in the TLB 120. In some examples, invalidation requests are for a single entry (e.g., associated with a particular virtual address) in the TLB 120, while in other examples, invalidation requests are for multiple entries (e.g., associated with a particular application ID) in the TLB 120.

Finally, the method 400 continues to block 410 with, responsive to a virtual address specified by the address invalidation request hitting the TLB 120, generating (e.g., by the matching logic 212) an invalidation match transaction and providing the invalidation match transaction to one of the general purpose transaction buffer 206 or a dedicated invalidation buffer 208. As described above, invalidation match transactions are able to be stored in the general purpose transaction buffer 206 or the dedicated invalidation buffer 208, and thus are not stalled behind other translation requests. For example, in a situation in which the general purpose transaction buffer 206 is full (e.g., pending the page table walker engine 122 performing address translations for transactions in the general purpose transaction buffer 206), an invalidation match transaction is still able to be stored in the dedicated invalidation buffer 208. Additionally, while the general purpose transaction buffer 206 and the dedicated invalidation buffer 208 are shown as separate blocks (e.g., in FIG. 2), in some examples, the buffers 206, 208 are combined in a single buffer. In such examples, accounting is performed (e.g., by the processor core 106, being aware of the size of the single buffer) so that space is available in the single buffer for an invalidation match transaction. For example, if the single buffer has a size of N, the processor core 106 is configured to stall additional translation requests once the single buffer reaches a capacity of N−1.

Figure 5:
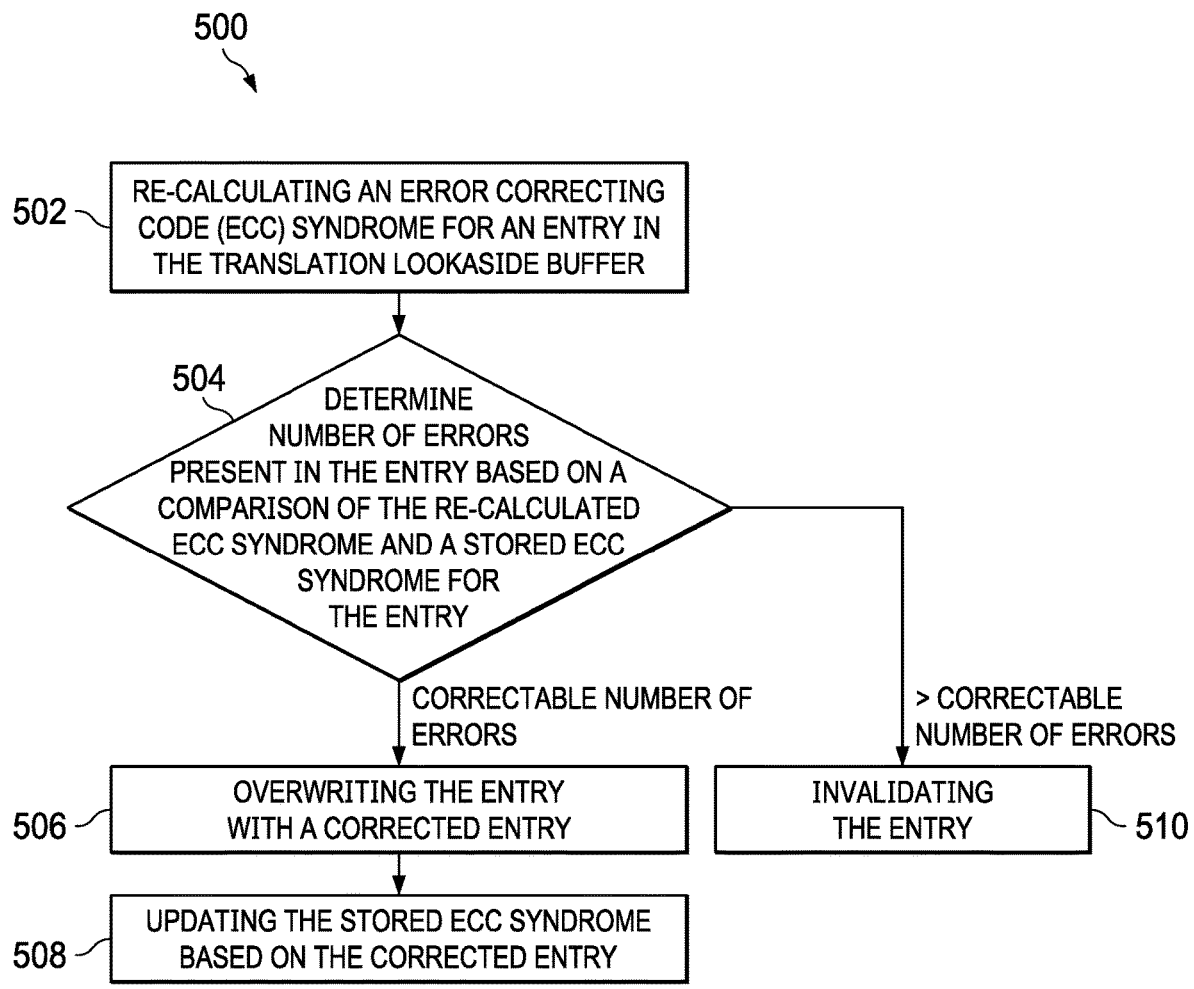
FIG. 5 is a flow chart of a method of detecting and correcting errors in a TLB in accordance with various examples.

FIG. 5 is a flow chart of a method 500 of detecting and/or correcting errors in the TLB 120 in accordance with various examples. The method 500 begins in block 502 with re-calculating an ECC syndrome for an entry in the TLB 120. The method 500 continues to block 504 with determining a number of errors present in the entry in the TLB 120 based on a comparison of the re-calculated ECC syndrome and an ECC syndrome stored for the entry.

Responsive to there being a correctable number of errors detected in the entry in the TLB 120, the method 500 continues to block 506, with overwriting the entry with a corrected entry. As described above, a single error is correctable when protected with a SECDED ECC syndrome, and thus the entry in the TLB 120 can be overwritten with a corrected entry (e.g., calculated by the invalidation engine 202) in which the single error is corrected. The method 500 continues further to block 508 with updating the stored ECC syndrome for the entry (e.g., the now-overwritten entry) based on the corrected entry. Thus, examples of this description not only provide non-stalling, non-blocking TLB 120 invalidation, but also correct errors in the TLB 120.

However, responsive to there being more errors detected in the entry in the TLB 120 in block 504 than the ECC technique is capable of correcting, the method continues to block 510, with invalidating the entry in the TLB 120. For example, because double errors (or greater) are detectable but not correctable when protected with a SECDED ECC syndrome, the entry in the TLB 120 is invalidated, and a future translation request for the virtual address previously translated in the now-invalidated entry results in re-performing such address translation and optionally caching the result in the TLB 120.

In the foregoing discussion and in the claims, the terms "including" and "comprising" are used in an open-ended fashion, and thus mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is illustrative of the principles and various embodiments of the present disclosure. Numerous variations and modifications will become apparent to those skilled in the art once the above disclosure is fully appreciated. The following claims should be interpreted to embrace all such variations and modifications.

What is claimed is:

1. A method, comprising:
   receiving, by a memory management unit (MMU) for a processor core,
   an address invalidation request from the processor core and providing the address invalidation request to a translation lookaside buffer (TLB) of the MMU; and
   responsive to a virtual address specified by the address invalidation request hitting the TLB, generating, by a matching logic of the TLB, an invalidation match transaction, and processing the invalidation match transaction by invalidating a first entry in the TLB specified by the invalidation match transaction, wherein processing the invalidation match transaction further comprises:
     re-calculating an error correcting code (ECC) syndrome for a second entry in the TLB,
     determining that a single error is present in the second entry based on a comparison of the re-calculated ECC syndrome and a stored ECC syndrome for the second entry,
     overwriting the second entry with a corrected entry, wherein the single error is corrected in the corrected entry, and
     updating the stored ECC syndrome based on the corrected entry.

2. The method of claim 1, further comprising:
   receiving, by the MMU, an address translation request from the processor core and providing the address translation request to the TLB;
   generating, by the matching logic of the TLB, an address transaction that indicates whether a virtual address specified by the address translation request hits the TLB;
   providing the address transaction to a general purpose transaction buffer; and
   providing the invalidation match transaction to a dedicated invalidation buffer responsive to the general purpose transaction buffer being full.

3. The method of claim 1, further comprising:
   receiving by the MMU, an address translation request from the processor core and providing the address translation request to the TLB;
   generating, by the matching logic of the TLB, an address transaction that indicates whether a virtual address specified by the address translation request hits the TLB;
   providing the address transaction to a general purpose transaction buffer; and
   receiving, by a page table walker engine of the MMU, the address transaction from the general purpose transaction buffer and processing the address transaction by:
   responsive to the address transaction indicating that the specified virtual address hit the TLB, providing the address transaction to a lower level memory for processing; and
   responsive to the address transaction indicating that the specified virtual address partially hit or missed the TLB, walking one or more page tables to determine an address translation including a physical address for the specified virtual address and providing the address transaction including the physical address to the lower level memory for processing.

4. The method of claim 3, further comprising, receiving, by an invalidation engine of the MMU, the invalidation match transaction from one of the general purpose transaction buffer or a dedicated invalidation buffer.

5. The method of claim 3, further comprising:
   receiving, by an invalidation engine of the MMU, the address invalidation request;
   determining, by the invalidation engine, whether the address invalidation request matches an address transaction in the general purpose transaction buffer or being processed by the page table walker engine; and
   responsive to the address invalidation request matching an address transaction, marking, by the invalidation engine, the matched address transaction.

6. The method of claim 5, further comprising, responsive to the matched address transaction being marked, not caching an address translation, determined responsive to processing the matched address transaction, in the TLB.

7. A method, comprising:
   receiving, by a memory management unit (MMU) for a processor core, an address invalidation request from the processor core and providing the address invalidation request to a translation lookaside buffer (TLB) of the MMU;
   responsive to a virtual address specified by the address invalidation request hitting the TLB, generating, by a matching logic of the TLB, an invalidation match transaction, and processing the invalidation match transaction by invalidating a first entry in the TLB specified by the invalidation match transaction, wherein processing the invalidation match transaction further comprises:
re-calculating an error correcting code (ECC) syndrome for a second entry in the TLB;
determining that more than one error is present in the second entry based on a comparison of the re-calculated ECC syndrome and a stored ECC syndrome for the second entry; and
responsive to the determination that more than one error is present in the second entry, invalidating the second entry.

8. A system, comprising:
a processor core; and
a memory management unit (MMU) coupled to the processor core and comprising a translation lookaside buffer (TLB) and an invalidation engine, the MMU configured to
receive an address invalidation request from the processor core and provide the address invalidation request to the TLB, wherein the TLB further comprises matching logic configured to,
responsive to a virtual address specified by the address invalidation request hitting the TLB, generate an invalidation match transaction, wherein the invalidation engine is configured to:
process the invalidation match transaction by invalidating a first entry in the TLB specified by the invalidation match transaction,
re-calculate an error correcting code (ECC) syndrome for a second entry in the TLB,
determine that more than one error is present in the second entry based on a comparison of the re-calculated ECC syndrome and a stored ECC syndrome for the second entry, and
responsive to the determination that more than one error is present in the second entry.

9. The system of claim 8, wherein the MMU is configured to:
receive an address translation request from the processor core and provide the address translation request to the TLB, wherein the matching logic is configured to generate an address transaction that indicates whether a virtual address specified by the address translation request hits the TLB and provide the address transaction to a general purpose transaction buffer; and
provide the invalidation match transaction to a dedicated invalidation buffer responsive to the general purpose transaction buffer being full.

10. The system of claim 8, wherein the MMU is configured to receive an address translation request from the processor core and provide the address translation request to the TLB, wherein the matching logic is configured to generate an address transaction that indicates whether a virtual address specified by the address translation request hits the TLB and provide the address transaction to a general purpose transaction buffer, and wherein the MMU further comprises a page table walker engine configured to receive the address transaction from the general purpose transaction buffer and process the address transaction by:
responsive to the address transaction indicating that the specified virtual address hit the TLB, providing the address transaction to a lower level memory for processing; and
responsive to the address transaction indicating that the specified virtual address partially hit or missed the TLB, walking one or more page tables to determine an address translation including a physical address for the specified virtual address and providing the address transaction including the physical address to the lower level memory for processing.

11. The system of claim 10, wherein the invalidation engine is configured to receive the invalidation match transaction from one of the general purpose transaction buffer or a dedicated invalidation buffer and process the invalidation match transaction.

12. The system of claim 10, wherein the invalidation engine is configured to:
receive the address invalidation request;
determine whether the address invalidation request matches an address transaction in the general purpose transaction buffer or being processed by the page table walker engine; and
responsive to the address invalidation request matching an address transaction, mark the matched address transaction.

13. The system of claim 12, wherein the MMU is further configured to, responsive to the matched address transaction being marked, not cache an address translation, determined responsive to processing the matched address transaction, in the TLB.

14. A system, comprising:
a processor core; and
a memory management unit (MMU) coupled to the processor core and comprising a translation lookaside buffer (TLB) and an invalidation engine, the MMU configured to receive an address invalidation request from the processor core and provide the address invalidation request to the TLB, wherein the TLB further comprises matching logic configured to, responsive to a virtual address specified by the address invalidation request hitting the TLB, generate an invalidation match transaction, and wherein the invalidation engine is configured to:
process the invalidation match transaction by invalidating a first entry in the TLB specified by the invalidation match transaction,
re-calculate an error correcting code (ECC) syndrome for a second entry in the TLB,
determine that a single error is present in the second entry based on a comparison of the re-calculated ECC syndrome and a stored ECC syndrome for the second entry,
overwrite the second entry with a corrected entry, wherein the single error is corrected in the corrected entry, and
update the stored ECC syndrome based on the corrected entry.

15. A memory management unit (MMU), comprising:
a translation lookaside buffer (TLB) comprising a plurality of pipeline stages configured to implement matching logic; and
an invalidation engine,
wherein the TLB is configured to
receive an address invalidation request from a processor core, wherein the matching logic is configured to,
responsive to a virtual address specified by the address invalidation request hitting the TLB, generate an invalidation match transaction, and wherein the invalidation engine is configured to:
process the invalidation match transaction by invalidating a first entry in the TLB specified by the invalidation match transaction, re-calculate an error correcting code (ECC) syndrome for a second entry in the TLB, determine whether an error is present in the second entry based on a comparison of the re-calculated ECC syndrome and a stored ECC syndrome for the second entry, in response to determining that a single error is present in the second entry, overwrite the second entry with a corrected entry, wherein the single error is corrected in the corrected entry, and update the stored ECC syndrome based on the corrected entry, or in response to determining that more than one error is present in the second entry, invalidate the second entry.

16. The MMU of claim 15, further comprising a general purpose transaction buffer coupled to the TLB, and a dedicated invalidation buffer coupled to the TLB, wherein the invalidation match transaction is provided to the dedicated invalidation buffer responsive to the general purpose transaction buffer being full.

17. The MMU of claim 16, wherein the general purpose transaction buffer is a first-in, first-out (FIFO) buffer, and wherein the dedicated invalidation buffer is a FIFO buffer.

18. The MMU of claim 15, further comprising a general purpose transaction buffer coupled to the TLB, and a dedicated invalidation buffer coupled to the TLB, wherein the TLB is configured to receive an address translation request from the processor core, wherein the matching logic is configured to generate an address transaction that indicates whether a virtual address specified by the address translation request hits the TLB, and provide the address transaction to the general purpose transaction buffer, and wherein the invalidation engine is configured to receive the invalidation match transaction from one of the general purpose transaction buffer or the dedicated invalidation buffer and process the invalidation match transaction.

19. The MMU of claim 15, further comprising a general purpose transaction buffer coupled to the TLB, and a dedicated invalidation buffer coupled to the TLB, wherein the TLB is configured to receive an address translation request from the processor core; wherein the matching logic is configured to generate an address transaction that indicates whether a virtual address specified by the address translation request hits the TLB, and provide the address transaction to the general purpose transaction buffer, and wherein the invalidation engine is configured to:

receive the address invalidation request;

determine whether the address invalidation request matches an address transaction in the general purpose transaction buffer or being processed by a page table walker engine of the MMU; and responsive to the address invalidation request matching an address transaction, mark the matched address transaction;

wherein the MMU is further configured to, responsive to the matched address transaction being marked, not cache an address translation, determined responsive to processing the matched address transaction, in the TLB.

20. The MMU of claim 15, wherein the invalidation engine is configured to:

in response to determining that a single error is present in the second entry, overwrite the second entry with a corrected entry, wherein the single error is corrected in the corrected entry, and update the stored ECC syndrome based on the corrected entry; and in response to determining that more than one error is present in the second entry, invalidate the second entry.

* * * * *